US009303192B2

(12) United States Patent
Kitazawa et al.

(10) Patent No.: US 9,303,192 B2
(45) Date of Patent: Apr. 5, 2016

(54) SHEET-LIKE ADHESIVE AND ORGANIC EL PANEL USING THE SAME

(71) Applicant: THREE BOND FINE CHEMICAL CO., LTD., Kanagawa (JP)

(72) Inventors: Hiromasa Kitazawa, Kanagawa (JP); Yoshihide Arai, Kanagawa (JP)

(73) Assignee: THREE BOND FINE CHEMICAL CO., LTD., Kanagawa (JP)

( * ) Notice: Subject to any disclaimer, the term of this patent is extended or adjusted under 35 U.S.C. 154(b) by 0 days.

(21) Appl. No.: 14/412,084

(22) PCT Filed: Jul. 1, 2013

(86) PCT No.: PCT/JP2013/068058
§ 371 (c)(1),
(2) Date: Dec. 30, 2014

(87) PCT Pub. No.: WO2014/007219
PCT Pub. Date: Jan. 9, 2014

(65) Prior Publication Data
US 2015/0137089 A1    May 21, 2015

(30) Foreign Application Priority Data

Jul. 5, 2012    (JP) ................................. 2012-151770

(51) Int. Cl.
*C09J 7/00*         (2006.01)
*C09J 163/00*       (2006.01)
(Continued)

(52) U.S. Cl.
CPC .. *C09J 7/00* (2013.01); *C09J 11/04* (2013.01); *C09J 163/00* (2013.01); *G09F 9/30* (2013.01);
(Continued)

(58) Field of Classification Search
CPC ............ C09J 7/00; C09J 11/04; C09J 163/00; H01L 51/5246; H01L 51/56; H01L 51/5253; G09F 9/30
See application file for complete search history.

(56) References Cited

U.S. PATENT DOCUMENTS 5,357,008 A * 10/1994 Tsai ..................... C08G 59/184
                                                        525/504
6,620,510 B1 * 9/2003 Taguchi .................... C08J 5/24
                                                        428/297.4
(Continued)

FOREIGN PATENT DOCUMENTS

CN      101601171 A    12/2009
CN      101827908 A     9/2010
(Continued)

OTHER PUBLICATIONS

International Search Report for PCT/JP2013/068058, dated Oct. 1, 2013, and English translation thereof.
(Continued)

*Primary Examiner* — John P Dulka
(74) *Attorney, Agent, or Firm* — Dickinson Wright PLLC

(57) ABSTRACT

A heat curable sheet-like adhesive for an organic EL panel, comprising components (A) to (C), which has tack in the surface of a composition comprising the components (A) to (C) at 25° C.:
the component (A): a film forming component having an epoxy equivalent of 7000 to 20000 g/eq and having compatibility with the component (B);
the component (B): an epoxy resin having an epoxy equivalent of 150 to 5000 g/eq and comprising 0 to 20% by weight of a solid epoxy resin at 25° C. with respect to the whole of the component (B); and
the component (C): an encapsulated epoxy adduct-type latent curing agent.

11 Claims, 2 Drawing Sheets

(51) Int. Cl.
*G09F 9/30* (2006.01)
*H01L 51/52* (2006.01)
*C09J 11/04* (2006.01)
*H01L 51/56* (2006.01)

(52) U.S. Cl.
CPC ........ *H01L 51/5246* (2013.01); *H01L 51/5253* (2013.01); *H01L 51/56* (2013.01); *C09J 2203/326* (2013.01); *C09J 2463/00* (2013.01)

(56) References Cited

U.S. PATENT DOCUMENTS

| | | | |
|---|---|---|---|
| 8,242,217 B2* | 8/2012 | Urakawa | C07C 323/52 525/403 |
| 2009/0239082 A1* | 9/2009 | Fujita | H05K 3/323 428/413 |
| 2010/0206623 A1* | 8/2010 | Kawate | C09J 163/00 174/259 |
| 2012/0048332 A1* | 3/2012 | Shimizu et al. | 136/244 |
| 2012/0207991 A1* | 8/2012 | Arai | B32B 15/08 428/216 |
| 2013/0128435 A1 | 5/2013 | Mizuta et al. | |

FOREIGN PATENT DOCUMENTS

| | | |
|---|---|---|
| CN | 103314453 A | 9/2013 |
| EP | 2 667 420 A1 | 11/2013 |
| JP | 2007-091901 | 4/2007 |
| JP | 2007-112956 | 5/2007 |
| JP | 2008-115338 | 5/2008 |
| JP | 2010-053353 | 3/2010 |
| JP | 2010-261003 | 11/2010 |
| JP | 2011-140617 | 7/2011 |
| WO | 2010/084939 | 7/2010 |
| WO | 2010/119706 | 10/2010 |
| WO | WO 2011/027815 A1 | 3/2011 |
| WO | 2012/014499 | 2/2012 |

OTHER PUBLICATIONS

International Preliminary Report on Patentability for PCT/JP2013/068058, dated Jan. 15, 2015, and English translation thereof.

Chinese Office Action dated Oct. 20, 2015, issued in corresponding Patent Application No. 201380035963.9.

* cited by examiner

SHEET-LIKE ADHESIVE AND ORGANIC EL PANEL USING THE SAME

TECHNICAL FIELD

The present invention relates to a sheet-like adhesive using an epoxy resin, which is suitable for assembly of an organic EL panel, and an organic EL panel using the sheet-like adhesive.

BACKGROUND ART

It has been known that a reactive sheet-like adhesive is conventionally cured in an atmosphere of high temperature of about 100° C. The reason is that, when formed into a sheet-like shape, with temperature at about 100° C., a cured state reaches a stage of partially curing or in the course of full curing, so-called B-stage. In other words, this is because, in order to promote further curing after the progress of curing, the further curing cannot be promoted without heating at a higher temperature than a temperature given at the time of forming into the B-stage. Patent literature 1 is an invention, which relates to an adhesive sheet; however, since there is no adhesion in the adhesive sheet itself, the adhesive sheet is stuck to a supporting substrate having an adhesive layer surface on the supporting substrate. It can be considered that this is because curing is advanced in the B-stage when the adhesion is formed into a sheet-like shape. As described above, a sheet-like adhesive in the B-stage has low adhesion to an adherend and, at the same time, is required to be heated at a higher temperature than 100° C. when adhered to an adherend, and hence, when an adherend is an electronic part with deterioration by a high temperature, damage to the adherend is large. In addition, since a sheet-like adhesive in the B-stage hardly exhibits flowability when heating, bubbles may be remained when there is unevenness on an adherend.

CITATION LIST

Patent Literature

Patent Literature 1: JP-2011-140617 A

SUMMARY OF INVENTION

Technical Problem

A conventional sheet-like adhesive has low adhesion to an adherend and, at the same time, is required to be heated at a high temperature of 100° C. or higher when adhered to an adherend, and hence, when an adherend is an electronic part with deterioration by a high temperature, damage to the adherend is large. In addition, since a sheet-like adhesive in the B-stage hardly exhibited flowability when heating, bubbles may be remained when there is unevenness on an adherend.

Solution to Problem

The inventors completed the invention that, as a result of a keen examination to attain the above objects, they found technique concerned with the most suitable sheet-like adhesive for an organic EL panel.

The summary of the invention is explained below. A first embodiment of the invention is a heat curable sheet-like adhesive for an organic EL panel, comprising components (A) to (C), which has tack in the surface of a composition comprising the components (A) to (C) at 25° C.:

the component (A): a film forming component having an epoxy equivalent of 7000 to 20000 g/eq and having compatibility with the component (B);

the component (B): an epoxy resin having an epoxy equivalent of 150 to 5000 g/eq and comprising 0 to 20% by weight of a solid epoxy resin at 25° C. with respect to the whole of the component (B); and the component (C): an encapsulated epoxy adduct-type latent curing agent.

A second embodiment of the invention is the heat curable sheet-like adhesive described in the first embodiment, wherein tack at 25° C. is 100 N/m or more in a 180-degree direction peeling test.

A third embodiment of the invention is the heat curable sheet-like adhesive described in either the first or second embodiment, which does not substantially comprise a curing agent and/or a curing accelerator other than the component (C).

A fourth embodiment of the invention is the heat curable sheet-like adhesive described in any one of the first to third embodiments, comprising 100 to 400 parts by mass of the component (B) based on 100 parts by mass of the component (A) and 5 to 40 parts by mass of the component (C) based on 100 parts by mass of the component (B).

A fifth embodiment of the invention is the heat curable sheet-like adhesive described in any one of the first to fourth embodiments, wherein the component (A) comprises a phenoxy resin synthesized from a bisphenol A type epoxy resin and/or a bisphenol F type epoxy resin.

A sixth embodiment of the invention is the heat curable sheet-like adhesive described in any one of the first to fifth embodiments, comprising 3-glycidoxypropyltrimethoxysilane as the component (D) and talc powder as the component (E).

A seventh embodiment of the invention is an organic EL panel manufactured by the heat curable sheet-like adhesive described in any one of the first to sixth embodiments.

An eighth embodiment of the invention is the organic EL panel described in the seventh embodiment, which is manufactured by heat-curing the heat curable sheet-like adhesive at 70 to 100° C.

A ninth embodiment of the invention is the organic EL panel described in either the seventh or eighth embodiment, which is manufactured by bonding a substrate formed with an organic EL layer and a protecting substrate to each other over the whole surface with the heat curable sheet-like adhesive.

A tenth embodiment of the invention is the organic EL panel described in any one of the seventh to ninth embodiments, manufactured by the way which the heat curable sheet-like adhesive is transferred onto either a substrate formed with an organic EL layer or a protecting substrate, and then the sheet-like adhesive is heated in the state of bonding both substrates to each other over the whole surface.

DESCRIPTION OF EMBODIMENTS

Figure 1:
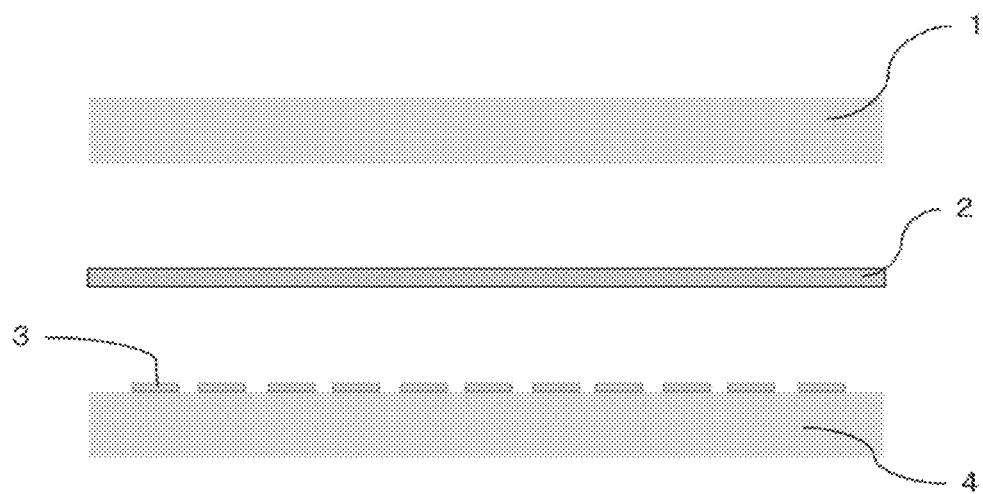
FIG. 1 illustrates a cross-sectional schematic view of constituting members in need, for sealing the whole surface of an organic EL panel using the sheet-like adhesive of the invention.

The details of the invention are described below. The invention is a sheet-like adhesive suitable for an organic EL panel, which exhibits flowability in the range of 40 to 70° C. and therefore the sheet-like adhesive does not entrain bubbles by following to unevenness of an organic EL substrate (no bubble is remained). In addition, since there is a low temperature curing from 70 to 100° C., preferably 70 to 90° C. (and also in a short time of 2.0 hours or less, preferably 1.5 hours or less, and more preferably 1 hour or less), the sheet-like adhesion does not generate dark spots and drive voltage variation. The invention also relates to an organic EL panel assembled by using the sheet-like adhesive.

The component (A) that can be used in the invention is a film forming component having an epoxy equivalent of 7000 to 20000 g/eq and having compatibility with the component (B). When the epoxy equivalent is less than 7000 g/eq, there is a tendency that film formation becomes difficult due to excess epoxy groups, and when the epoxy equivalent exceeds 20000 g/eq, there is a tendency that a sheet becomes fragile. The most preferable component as the component (A) is a phenoxy resin having an epoxy group. Such compound is specifically a multimer of a bisphenol A type epoxy resin and a bisphenol F type epoxy resin, and has epoxy groups at both terminals. More preferably, it is a phenoxy resin synthesized from a bisphenol A type epoxy resin and/or a bisphenol F type epoxy resin. A modified type having a skeleton other than a bisphenol skeleton may be used when it is compatible with the component (B); however, a phenoxy resin comprising bisphenol A and/or bisphenol F is preferable by taking account of costs. Adding the component (A) makes it possible to form into a sheet form without partially reacting epoxy groups such as the so-called B-stage.

Specific examples of the above epoxy resins include, without limitation, 1256, 4250, 4275, 1255HX30, YX8100BH30, YX6954BH30 and so on, manufactured by Mitsubishi Chemical Corporation, and YP-50, YP-505, YP-55U, YP-70 and so on, manufactured by NIPPON STEEL & SUMIKIN CHEMICAL CO., LTD., or solvent cut types thereof.

The component (B) which can be used in the invention is an epoxy resin having an epoxy equivalent of 150 to 5000 g/eq and comprising 0 to 20% by weight of a solid epoxy resin at 25° C. with respect to the whole of the component (B). When an epoxy equivalent is less than 150 g/eq, there is a deteriorative tendency of curing, and when the epoxy equivalent exceeds 5000 g/eq, there is a tendency that a sheet after film formation becomes fragile. In addition, when a solid epoxy resin is contained more than 20% by weight of the whole component (B), tack cannot be generated in a sheet-like adhesive. The component (B) may be combined with a number of epoxy resins. A solid epoxy resin at 25° C. is present in the epoxy resin having an epoxy equivalent of less than 7000 g/eq, however, when all of the component (B) is a solid epoxy resin, it is unable to form into a sheet form. In addition, when a liquid epoxy resin at 25° C. may not be added, tack cannot be generated in the surface of a sheet-like adhesive. Tack is defined as the state having viscosity; however, a sheet form cannot be maintained when viscosity is enough to break the sheet. Therefore, it is necessary that the surface of a sheet-like adhesive has tack, and a ratio for maintaining a sheet form is 0 to 20% by weight of solid epoxy resin and the remaining 80 to 100% by weight of liquid epoxy resin with respect to the whole of the component (B).

Examples of the epoxy resin include, without limitation, bisphenol A type, bisphenol F type, phenol novolak type, and cresol novolak type and so on. Specific names of commodities, for examples of liquid epoxy resins at 25° C., include EPICLON840, 840S, 850, 850S, 850CRP, 850LC, 830, 830S, 830LVP, 835, 835LV and so on, manufactured by DIC CORPORATION, and 827, 828, 834, 806, 807 and so on, manufactured by Mitsubishi Chemical Corporation, and for examples of solid epoxy resins at 25° C. include EPICLON 860, 1050, 1055, 3050, 4050, 7050, N660, N665, N670, N673, N680, N695 and so on, manufactured by DIC CORPORATION, and 1001, 1002, 1003, 1055, 1004, 1004AF, 1007, 4005P, 4007P, 4010P and so on, manufactured by Mitsubishi Chemical Corporation, or solvent cut products thereof.

It is the most preferable to add 100 to 400 parts by mass of the component (B) based on 100 parts by mass of the component (A). When the component (B) is 100 parts by mass or more, tack is easily generated in the surface of the composition comprising the components (A) to (C) at 25° C., and when the component (B) is 400 parts by mass or less, it is easy to form into a sheet form. The invention is required to have tack in the surface of a composition comprising the components (A) to (C) at 25° C. Adhesion to an adherend is affected by the components (A) to (C), for adhering without remaining air gaps with a sheet-like adhesive when the sheet-like adhesive is pressed onto the adherend during lamination. In particular, when fine unevenness exists on an adherend, air gaps are left because it is unable to follow the unevenness without tack and then the sheet is floated.

The component (C) that can be used in the invention is an encapsulated epoxy adduct-type latent curing agent. An epoxy adduct is generally known as an epoxy adduct compound by reacting an epoxy resin typically represented by a bisphenol A type epoxy resin and the like with a tertiary amine compound in halfway steps. Powder obtained by pulverizing the above epoxy adduct compound can be used as a curing agent having latency. Furthermore, in order to encapsulate an active site of the surface, there is to form a pseudo capsule by forming a cured product on the surface when isocyanate compound and the like having a rapid reaction with the amino compound are sprinkled. Specific examples that can be used as the component (C) include, without limitations, NOVACURE series manufactured by Asahi Kasei Chemicals Corporation and so on. From the viewpoint of storage stability of a stock solution, it is the most preferable that other curing agents and curing accelerators are not used in combination. In addition, by using the component (C), a temperature for curing a sheet-like adhesive can be set at a low temperature of 70 to 100° C., preferably 70 to 90° C. (a cure time can be also set to a short time of 2.0 hours or less, preferably 1.5 hours or less, and more preferably 1 hour or less), and therefore, adverse effects on an organic EL panel can be reduced. Note that as the above cure time, the shorter cure time the better. Since a time until the completion of cure may be changed due to temperatures, it is difficult to be clearly defined; however, as a general tendency, it can be cured in a short time at a high temperature rather than a low temperature. Accordingly, the upper limit of the cure time is 2.0 hours or less, preferably 1.5 hours or less, and more preferably 1 hour or less because of a low temperature range of the above cure temperature (approximately from 70 to 85° C.) with requiring a long time, and from relationship of a line tact, those are also preferable from the viewpoint that adverse effects on an organic EL panel such as dark spots, drive voltage variation and so on can be reduced. On the other hand, from the viewpoint that the shorter time the better, it is preferred that the lower limit of the cure time is not limited especially but is set to 15 minutes or more, preferably 30 minutes or more because of a high temperature region of in the above cure temperature range (approximately from 85 to 100° C.), which facilitates a shorter cure time.

It is preferable to add 5 to 40 parts by weight of the component (C) based on 100 parts by weight of the component (B); more preferably, 10 to 30 parts by weight. When it is 5 parts by weight or more, bond strength is more stabilized, and when it is 40 parts by weight or less, storage stability of a stock solution can be enhanced.

The component (D) that can be used in the invention is a silane coupling agent. Specific examples of the component (D) include, without limitations, silane coupling agents and the likes, such as 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-γ-aminopropyltrimethoxysilane, N-(2-aminoethyl) 3-aminopropylmethyldimethoxysilane, N-(2-aminoethyl) 3-aminopropylmethyltrimethoxysilane, 3-aminopropyltriethoxysilane, 3-mercaptopropyltrimethoxysilane, vinyltrimethoxysilane, N-(2-(vinylbenzylamino) ethyl) 3-aminopropyltrimethoxysilane hydrochloride, 3-methacryloxypropyltrimethoxysilane and so on. These silane coupling agents may be mixed in two or more kinds. As a coupling agent, a coupling agent having a hydrolyzable silyl group is preferable, and a coupling agent having an epoxy group is more preferable from the viewpoint of compatibility with the component (A) and the component (B). In particular, 3-glycidoxypropyltrimethoxysilane is particularly preferable from the viewpoint of adhesion propensity to an adherend.

It is preferable to add 0.1 to 10 parts by weight of the component (D) based on 100 parts by weight of the component (B); more preferably, 0.5 to 5 parts by weight. When it is 0.1 parts by weight or more, bond strength is more stabilized, and when it is 10 parts by weight or less, an increasing amount of outgas can be effectively suppressed and prevented.

The component (E) that can be used in the invention is a talc powder. Heat resistance and moisture resistance are improved by use of talc powder. An average particle diameter of talc powder is preferably within the range from 0.1 to 50 μm. When the average particle diameter of talc powder is 0.1 μm or more, storage stability can be improved, and when the average particle diameter of talc powder is 50 μm or less, a smooth coating film can be formed. In addition, the average particle diameter of talc powder can be measured with a laser particle size analyzer. As an adding amount of the component (E), 10 to 40 parts by mass is suitable based on 100 parts by mass sum of the components (A) and (B). When the adding amount is 10 parts by weight or more, toughness of a cured product can be improved, and when the adding amount is 40 parts by weight or less, storage stability can be improved.

The sheet-like adhesive of the invention may be incorporated with suitable amounts of additives such as a reactive diluent, coloring agents including pigments, dyes and so on, organic fillers, inorganic fillers, plasticizers, antioxidants, defoaming agents, antiaging agents, leveling agents, and a rheology control agents and so on, depending on the extent as not to damage the desired effects of the invention. According to addition of these additives, an excellent composition in resin strength, bond strength, workability, storage stability, and the like, and its cured product thereof can be obtained.

There is the sheet-like adhesive of the invention that tack at 25° C. is preferably 100 N/m or more in a 180-degree direction peeling test, and more preferably 200 N/m or more. When the tack is 100 N/m or more, it can be sufficiently followed to the unevenness in the case of being fine unevenness on an adherend.

The invention forms the sheet-like adhesive by preparing stock solution which is added solvents to a composition comprising the components (A) to (E) (hereinafter, the composition containing the solvent is called a stock solution), and by forming a smooth film on a release firm with a coating machine, and then by volatilizing the solvent at less than 40° C. The sheet-like adhesive in this process is formed into a sheet form in an unreacted state. In addition, when formed into the sheet form in advance, a thermal transfer to an adherend can be easily carried out by a laminator, or the like. The above solvent is not limited as long as it is compatible with the components (A) and (B), and specific examples thereof include methyl ethyl ketone, toluene, xylene and so on.

Figure 2:
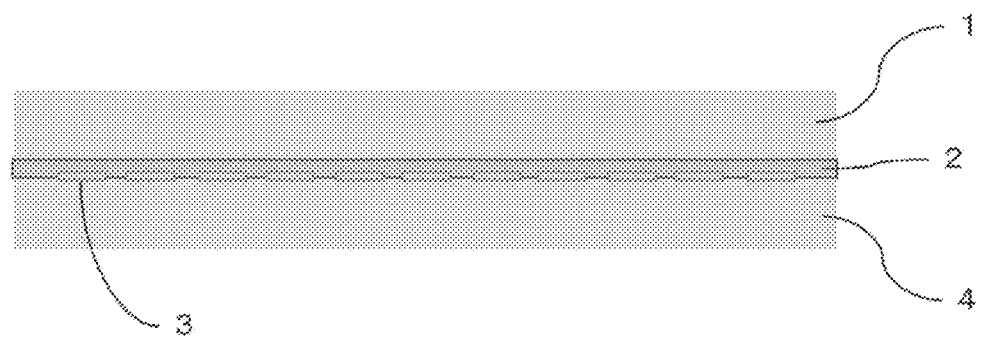
FIG. 2 illustrates a cross-sectional schematic view of an organic EL panel in assembling the constituting members in FIG. 1.
Figure 3:
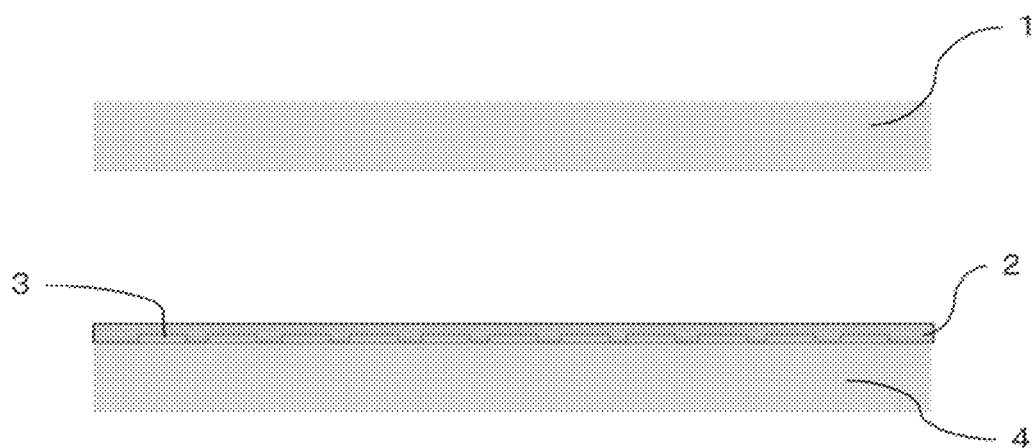
FIG. 3 illustrates a cross-sectional schematic view in transfer status of the sheet-like adhesive of the invention onto an organic EL substrate.
Figure 4:
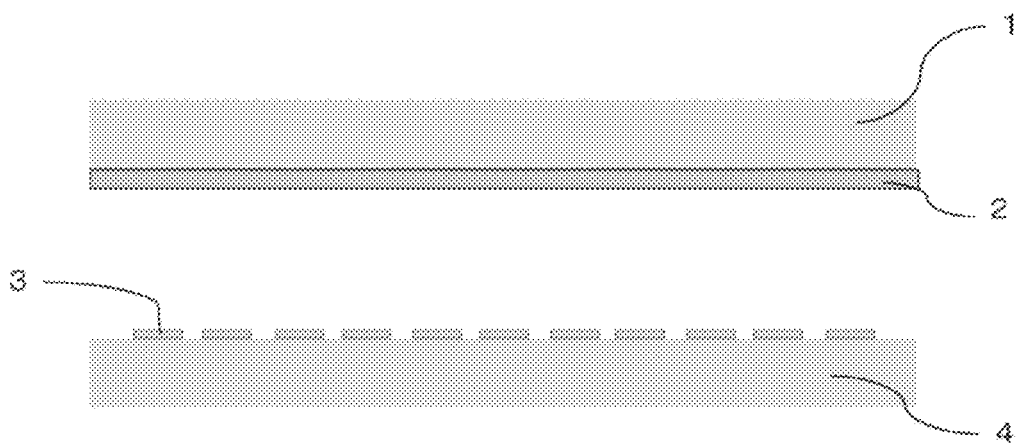
FIG. 4 illustrates a cross-sectional schematic view in transfer status of the sheet-like adhesive of the invention onto a protecting material (protecting substrate).

The sheet-like adhesive formed on a release film is transferred to an adherend with a roll laminator, or the like, and the release film is peeled off. Then, another adherend is set by positioning and heated at 70 to 100° C., preferably at 70 to 90° C. with a vacuum laminator, a thermocompression bonding machine and so on. The sheet-like adhesive of the invention is preferable to exhibit flowability within the range of 40 to 70° C. This is because, when an organic EL element is sealed, a heat-fluidized sheet-like adhesive is smoothly filled into unevenness in the surface of the element to get rid of bubbles. When this flow temperature is lower than 40° C., flowability of the sheet-like adhesive is excessively large in thermal transfer or in sealing by heat curing, which easily causes dripping. On the other hand, when it exceeds 70° C., the sheet-like adhesive starts to be gelation since the temperature reaches the reaction start temperature of the component (C). In the case of sheet formation in the so-called B-stage, a reaction partially proceeds and, therefore, flowability is hardly exhibited when reheated, and followability to an adherend having unevenness is lowered. A liquid adhesive, when heated and cured, continues to make a resin spread until lowering of flowability due to gelatinization, however, the sheet-like adhesive does not change its adhesion area even after heating. Therefore, in an organic EL panel comprising the constituting member of organic EL substrate 4 where the protecting substrate (protecting material or protecting film) 1, the sheet-like adhesive 2 and the organic EL elements 3 as illustrated in FIG. 1 are formed, the sheet-like adhesive 2 of the invention is most suitable for sealing the entire surface of the organic EL panel as illustrated in FIG. 2. That is, the organic EL panel is provided, which is manufactured (totally sealed) by attaching the protecting substrate 1, and the side of the organic substrate 4, which is formed organic EL (layer) element 3, to each other over the whole surface with the sheet-like adhesive 2. Transfer of the sheet-form adhesive 2 may be either on the side of the organic EL substrate 4 where the organic EL element 3 is formed, as illustrated in FIG. 3, or on the side of the protective substrate 1 including a glass protective plate, a plastic protective film or the like, which protects the organic EL substrate 4, as illustrated in FIG. 4. In addition, the sheet-like adhesive 2 may also be formed by forming a coating film of a stock solution in the surface of the organic EL substrate 4 or the surface of the protective substrate 1 and volatilizing a solvent. That is, after transferring the sheet-like adhesive 2 to either the organic EL substrate 4 into which the organic EL (layer) element 3 is formed or the protective substrate 1, the organic EL panel is provided, which is manufactured by heating the above sheet-like adhesive 2 in attaching both substrates to each other on the whole surfaces. The sheet-like adhesive of the invention is cured at a low temperature of 70 to 100° C., preferably 70 to 90° C. (also in 2.0 hours or less, preferably 1.5 hours or less, and more preferably 1 hour or less) and therefore it cannot generate dark spots and vary drive voltages to an organic EL panel.

EXAMPLES

Next, the invention is explained more specifically with examples, without limitations.

In order to manufacture the sheet-like adhesives of Examples 1 to 10 and Comparative Examples 1 to 8, the following components required for preparation of a stock solution were prepared (a product formed into a film by drying a solvent from a stock solution is called a sheet-form adhesive).

Component (A): a film forming component having an epoxy equivalent of 7000 to 20000 g/eq and compatibility with the component (B)

Phenoxy resin having an epoxy equivalent of 8000 g/eq (jER1256 manufactured by Mitsubishi Chemical Corporation)

Component (B): an epoxy resin having an epoxy equivalent of 150 to 5000 g/eq

Solid bisphenol A type epoxy resin at 25° C. having an epoxy equivalent of 650 g/eq (jER1002 manufactured by Mitsubishi Chemical Corporation)

Liquid bisphenol F type epoxy resin at 25° C. having an epoxy equivalent of 163 g/eq (EPICLON EXA835LV manufactured by DIC CORPORATION)

Component (C): an encapsulated epoxy adduct-type latent curing agent

Master comprising 30% by weight of an encapsulated type amine adduct latent curing agent in an epoxy resin (mixture of bisphenol A type epoxy resin and bisphenol F type epoxy resin) (NOVACURE HX3941HP manufactured by Asahi Kasei E-materials Corporation)

Master comprising 30% by weight of an encapsulated type amine adduct latent curing agent in an epoxy resin (mixture of bisphenol A type epoxy resin and bisphenol F type epoxy resin) (NOVACURE HX3921HP manufactured by Asahi Kasei E-materials Corporation)

Component (C'):

1-cyanoethyl-2-phenylimidazolium trimellitate (CUREZOL 2PZCNS-PW manufactured by SHIKOKU CHEMICALS CORPORATION)

2,4-diamino-6-[2'-methylimidazolyl-(1')]-ethyl-S-triazine isocyanuric acid adduct (CUREZOL 2MAOK-PW manufactured by SHIKOKU CHEMICALS CORPORATION)

Non-encapsulated type amine adduct latent curing agent (AJICURE PN-23 manufactured by Ajinomoto Fine-Techno Co., Inc.)

Non-encapsulated type amine adduct latent curing agent (FUJICURE FXE1000 manufactured by T&K TOKA CO., LTD)

Dicyandiamide (OMICURE DDA5 manufactured by PTI Japan Ltd.)

Component (D): coupling agent 3-glycidoxypropyltrimethoxysilane (KBM403 manufactured by Shin-Etsu Chemical Co., Ltd)

Component (E): talc powder

Talc powder with average particle diameter of 1 μm (SG2000 manufactured by NIPPON TALC Co., Ltd.)

Other: solvent

Methyl ethyl ketone (reagent)

The component (A), the component (B), the component (D) and a suitable amount of a solvent were added and mixed with a uniaxial stirring machine to be stirred until the mixture became uniform. Then, the component (C) (or the component (C')) was added and stirred, and thereto was finally added the component (E) and then stirred until the mixture became uniform to thus produce a stock solution. The detailed preparation amount of the stock solution is according to Table 1 and all numerical values are expressed by part by mass.

TABLE 1

| Components | Raw materials | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Component (A) | jER1256 | 100 | 100 | 100 | 100 | 100 | 100 | 100 | 100 | 100 | 100 |
| Component (B) | jER1002 | 33 | 20 | 20 | 20 | | | | | | |
| | EXA835LV | 67 | 100 | 120 | 120 | 100 | 120 | 140 | 140 | 250 | 250 |
| | Component (B) derived from component (C) | 93 | 127 | 112 | 112 | 93 | 126 | 112 | 112 | 105 | 105 |
| Component (C) | HX3941HP (Component (C) only) | 40 | 54 | 48 | 48 | 40 | 54 | 48 | 48 | 45 | |
| | HX3921HP (Component (C) only) | | | | | | | | | | 50 |
| | 2PZCNSPW | | | | | | | | | | |
| | 2MAOK-PW | | | | | | | | | | |
| | PN23 | | | | | | | | | | |
| | FXE1000 | | | | | | | | | | |
| | DDA-5 | | | | | | | | | | |
| Component (D) | KBM403 | 5 | 5 | 5 | 5 | 5 | 5 | 5 | 5 | 5 | 5 |
| Component (E) | SG2000 | | | | 70 | | | | 70 | | |
| Total | | 338 | 406 | 405 | 475 | 338 | 405 | 405 | 475 | 505 | 510 |

TABLE 1-continued

| Components | Raw materials | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Component (A) | jER1256 | 100 | 100 | 100 | 100 | 100 | 100 | 100 | 100 |
| Component (B) | jER1002 | 49 | 67 | 117 | | | | | |
| | EXA835LV | 49 | 33 | 17 | 250 | 250 | 250 | 250 | 250 |
| | Component (B) derived from component (C) | 93 | 93 | 94 | | | | | |
| Component (C) | HX3941HP (Component (C) only) | 40 | 40 | 40 | | | | | |
| | HX3921HP (Component (C) only) | | | | | | | | |
| | 2PZCNSPW | | | | 10 | | | | |
| | 2MAOK-PW | | | | | 10 | | | |
| | PN23 | | | | | | 50 | | |
| | FXE1000 | | | | | | | 50 | |
| | DDA-5 | | | | | | | | 50 |
| Component (D) | KBM403 | 5 | 5 | 5 | 5 | 5 | 5 | 5 | 5 |
| Component (E) | SG2000 | | | | | | | | |
| Total | | 336 | 338 | 373 | 365 | 365 | 405 | 405 | 405 |

Table 2 illustrates total parts by mass of the component (B) based on 100 parts by mass of the component (A), a ratio (%) of adding a solid epoxy resin at 25° C. in the component (B), and an adding amount (part by mass) of the component (C) per 100 parts by mass of the component (B) in a stock solution.

TABLE 2

| Items | Example 1 | Example 2 | Example 3 | Example 4 | Example 5 | Example 6 | Example 7 | Example 8 | Example 9 | Example 10 |
|---|---|---|---|---|---|---|---|---|---|---|
| Total of component (B) | 193 | 247 | 252 | 252 | 193 | 246 | 252 | 252 | 355 | 355 |
| Ratio (%) of solid component (B) at 25° C. in the component (B) | 17 | 8 | 8 | 8 | 0 | 0 | 0 | 0 | 0 | 0 |
| Adding amount (part by mass) of component (C) per 100 parts by mass of component (B) | 21 | 22 | 19 | 19 | 21 | 22 | 19 | 19 | 13 | 14 |

| Items | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Total of component (B) | 191 | 193 | 228 | 250 | 250 | 250 | 250 | 250 |
| Ratio (%) of solid component (B) at 25° C. in the component (B) | 26 | 35 | 51 | 0 | 0 | 0 | 0 | 0 |
| Adding amount (part by mass) of component (C) per 100 parts by mass of component (B) | 21 | 21 | 18 | 4 | 4 | 20 | 20 | 20 |

[Forming of Sheet-Like Adhesive]

The above stock solution was applied on a release film with a coating machine to have a thickness of 20 μm, and a sheet was formed by volatilization and solidification of a solvent at 40° C. (Hereinafter, the numbers of Examples•Comparative Examples of stock solutions are directly reflected as the numbers of Examples•Comparative Examples of sheet-like adhesives. In addition, a sheet-like adhesive is also called simply a sheet.)

In order to confirm characteristics of stock solutions and sheets of Examples 1 to 10 and Comparative Examples 1 to 8, storage stability of the sheet-like adhesives, confirmation of tack of the sheet-like adhesives, measurements of outgas during curing, and measurements of a flow starting temperature was carried out.

[Storage Stability of Sheet-Like Adhesive]

A sheet immediately after production was peeled from a release film, 15 sheets were stacked and punched out to be a cylindrical form having a diameter of 4 mm. The mass of the sheets that was punched out (7.5±0.5 mg) was set in the sample chamber of DSC (DSC220 manufactured by Seiko Instruments Inc.). There was measured within the temperature range of 20° C. to 250° C. at a temperature rising rate of 10° C./min. After completion of the measurement, quantity of heat (J/cm$^2$) of an exothermic peak from 90 to 220° C. was read from a chart. The quantity of heat in this step was assumed to be "the initial quantity of heat (J/cm$^2$)" in the calculating formula described below. Then, the sheet was stored at 5° C. and measurements of quantity of heats were performed with DSC in every month. According to the following calculating formula, "change rate (%)" was calculated and a month having the change rate of more than 20% was confirmed. The quantity of heat in this step was assumed to be "quantity of heat in storage at 5° C. (J/cm$^2$)" in the calculating formula described below. The obtained change rate was evaluated according to the following criteria. The evaluating results are shown in Table 3. Storage stability of the invention is preferably "o" in the criteria. When the criteria is not "o", there is a possibility to decrease tack because of excessively high reactivity Criteria
◯: 6 months or more
Δ: 1 month or more and less than 6 months
x: less than 1 month

[Math. 1]

$$\text{"Change rate (\%)"} = \frac{\text{"Initial quantity of heat (J/cm}^2\text{)"} - \text{"Quantity of heat in storage at 5° C.(J/cm}^2\text{)"}}{\text{"Initial quantity of heat (J/cm}^2\text{)"}} \times 100 \quad \text{math. 1}$$

[Confirmation of Tack of Sheet-Like Adhesives]

A sheet was heat-transferred within the range of a length of 75 mm to the PET film (COSMO SHINE A4300 (thickness of 125 μm) manufactured by TOYOBO CO., LTD.) which was cut in a width of 5 mm×a length of 200 mm, from the film edge by using a roll laminator at 80° C. After peeling a release film, test pieces were manufactured by transferring the transferred PET film by using a roll laminator at 25° C. to an alkali glass having a width of 25 mm×a length of 100 mm×a thickness of 2 mm. 180-degree peeling adhesion force tests for the manufactured pieces were performed with a universal tensile testing machine in 50 mm/min peeling rate. The "peel adhesive strength (N/m)" was found from an integral average excluding an initial peak. "Tack" was evaluated from the calculated "peel adhesive strength" based on the following criteria. The evaluation results are represented in Table 3. In the invention, "tack" or "slightly tack" is preferable, and in the other case, there is no adhesion to an adherend in laminating and there is a possibility of generating air gaps.

Criteria
Tack: 200 N/m or more
Slightly Tack: 100 N/m or more and less than 200 N/m
None: less than 100 N/m

[Measurement of Outgas During Curing]

5 mg of the sheet was measured, and an outgas amount was measured, which was generated in heating at 120° C.×15 minutes in the dynamic space method using a double-shot pyrolyzer and a gas chromatography/mass spectrometry (GC-MS). The total amount of generated outgas was quantitated with n-Decane used as a standard substance. This outgas amount is assumed to be an "outgas amount during curing (ppm)". Table 3 illustrates the results of the obtained "outgas amount during curing (ppm)". In the invention, it is preferably lower than 1500 ppm. When it is 1500 ppm or more, outgas is generated from the sheet and there is a possibility of increasing dark spots.

[Measurement of Flow Starting Temperature]

A sheet was peeled from a release film, and 5 sheets were laminated so as to have a thickness of about 100 μm and deaerated with a vacuum laminator. Viscoelasticity measurement was performed within the temperature range of 25° C. to 150° C. with the rheometer (DAR-100 manufactured by Reologica). A temperature of tan δ=1 is assumed to be a "flow starting temperature (° C.)". In the invention, the flow starting temperature is preferably 40 to 70° C. or less. When the flow starting temperature is higher than 70° C., there is a possibility of giving damage to an organic EL panel, and when the flow starting temperature is lower than 40° C., there is a possibility of contaminating an adherend because of generating strong tack.

TABLE 3

| Test items | Example 1 | Example 2 | Example 3 | Example 4 | Example 5 | Example 6 | Example 7 | Example 8 | Example 9 | Example 10 |
|---|---|---|---|---|---|---|---|---|---|---|
| Storage stability | | | | | | | | | | |
| Tack | Slightly tack | Slightly tack | Slightly tack | Slightly tack | Slightly tack | tack | tack | Slightly tack | tack | tack |
| Outgas during curing | 1200 | 1350 | 1420 | 1080 | 1100 | 1050 | 1060 | 1020 | 600 | 720 |
| Flow starting temperature | 63 | 60 | 48 | 50 | 58 | 50 | 48 | 44 | 40 | 38 |

| Test items | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Storage stability | | | | r | | í | í | |
| Tack | None | None | None | tack | tack | tack | tack | tack |
| Outgas amount during curing | 1250 | 1150 | 1050 | 1900 | 1500 | 1800 | 1900 | 1700 |
| Flow starting temperature | 62 | 63 | 68 | 50 | 50 | 52 | 52 | 53 |

Examples 4 and 8 seem to hardly exhibit tack due to contain talc, however, resin components are the same as Example 3 and 7 respectively, and therefore, tack is exhibited similarly to Examples 3 and 7. In addition, each also shows a temperature near to the flow starting temperature respectively. On the other hand, since Comparative Examples 1 to 3 have a high ratio of the solid component (B) at 25° C. in the component (B) in Table 2, it is difficult to generate tack, and it is believed to generate tack within the range of 0 to 20% by weight according to examples. In Comparative Examples 4 to 8, outgas is largely generated although it is not clear due to an effect of a curing agent. In addition, it is considered that storage stability of a sheet can be maintained by using the component (C) of the invention.

Organic EL panels were manufactured by using the sheets of Example 1, Example 2 and Comparative Examples 1 to 5, and evaluation of dark spots and evaluation of drive voltage variation were performed. (Hereinafter, the numbers of sheets of Examples and Comparative Examples are directly reflected as the numbers of Examples and Comparative Examples of organic EL panels.)

[Manufacture of Organic EL Panel]

A transparent electrode by sputtering was formed with the thickness of 0.1 μm on a glass plate. Subsequently, a hole transport layer and an organic EL layer were serially formed with the thickness of 0.05 μm on the transparent electrode. In addition, the organic EL elements 3 were manufactured by forming with a thickness of 0.2 μm of a back electrode on the organic EL layer (refer to FIG. 1). The sheet 2 was transferred with a roll laminator at 80° C. to the organic EL substrate 4 on which the organic EL elements 3 were formed onto a glass plate (refer to FIG. 3). A glass plate as protecting substrate 1 was overlapped on the transferred organic EL, and it was heat-pressed with a vacuum laminator. Then, the organic EL panel was manufactured by complete-curing the sheet with a heat drier according to curing conditions of each sheet in Table 4 (refer to FIG. 2).

[Evaluation of Dark Spots]

Growth of dark spots was observed in the atmosphere of 60° C. and 90% RH by continuous lighting. Generation of dark spots was confirmed after the lapse of 1000 hours according to the following criteria.

Criteria

○: No dark spot
△: Dark spots with a diameter of less than 100 μm were slightly occurred
x: Dark spots with a diameter of 100 μm or more were apparently occurred.

[Evaluation of Drive Voltage Variation]

Evaluation of drive voltage variation was performed in order to evaluate changes of light-emitting characteristics. A drive voltage was measured when a current of 0.1 mA was applied to each piece with a constant-voltage power supply device. The drive voltage variation was evaluated by changes of drive voltage before and after still-standing of test pieces of each panel for 1000 hours in the atmosphere of 60° C. and 90% RH.

Criteria

○: No drive voltage rise
△: Less than 10% of drive voltage rise
x: 10% or more of drive voltage rise.

It is believed that Comparative Examples 1 to 3 have no tack and a sealed state is bad in order not to follow unevenness in the surface of organic EL elements. It may be considered that Comparative Examples 4 and 5 have tack but outgas is largely generated, which deteriorates the organic EL elements. In addition, Comparative Examples 1, 2 and 5 are considered to cause damages to the organic EL elements because of 3 hours needed even at a curing temperature of 100° C. On the other hand, in Examples 1 and 2, dark spots and drive voltage variation are satisfactory because there is the following capability of roughness and curing is available at 80° C.

INDUSTRIAL APPLICABILITY

It is believed that importance of sealing material in an organic EL panel increases since organic EL techniques have been used for a large display. The invention is the sheet-form adhesive, which can seal with high precision and therefore it is suitable for the large display having difficulty to keep quality.

The present application is based on the Japanese Patent Application No. 2012-151770 filed on Jul. 5, 2012, and the disclosure content thereof is referenced here and made a part of hereof as a whole.

REFERENCE SIGNS LIST

1: Protecting substrate (protecting plate or protecting film)
2: Sheet-like adhesive
3: Organic EL element
4: Organic EL substrate

The invention claimed is:

1. A heat curable sheet-like adhesive for an organic EL panel comprising components (A) to (C), which has tack in a surface of a composition comprising the components (A) to (C) at 25° C.:
   the component (A): a film forming component having an epoxy equivalent of 7000 to 20000 g/eq and having compatibility with the component (B);
   the component (B): an epoxy resin having an epoxy equivalent of 150 to 5000 g/eq and comprising 0 to 20% by weight of a solid epoxy resin at 25° C. with respect to a whole of the component (B); and
   the component (C): an encapsulated epoxy adduct-type latent curing agent.

2. The heat curable sheet-like adhesive according to claim 1, wherein said tack at 25° C. is 100 N/m or more in a 180-degree direction peeling test.

3. The heat curable sheet-like adhesive according to claim 1, wherein a curing agent and/or curing accelerator other than the component (C) is not substantially comprised.

4. The heat curable sheet-like adhesive according to claim 1, comprising 100 to 400 parts by mass of the component (B) based on 100 parts by mass of the component (A) and com-

TABLE 4

| Test items | Example 1 | Example 2 | Comparative Example 1 | Comparative Example 2 | Comparative Example 3 | Comparative Example 4 | Comparative Example 5 |
|---|---|---|---|---|---|---|---|
| Dark spots | ○ | ○ | x | △ | △ | △ | △ |
| Drive voltage variation | ○ | ○ | △ | △ | ○ | △ | △ |
| Curing condition | 80° C. 1 h | 80° C. 1 h | 100° C. 3 h | 100° C. 3 h | 80° C. 1 h | 80° C. 1 h | 150° C. 3 h | prising 5 to 40 parts by mass of the component (C) based on 100 parts by mass of the component (B).

5. The heat curable sheet-like adhesive according to claim 1, wherein the component (A) comprises a phenoxy resin synthesized from a bisphenol A type epoxy resin and/or a bisphenol F type epoxy resin.

6. The heat curable sheet-like adhesive according to claim 1, comprising 3-glycidoxypropyltrimethoxysilane as the component (D) and talc powder as a component (E).

7. An organic EL panel comprising the heat curable sheet-like adhesive according to claim 1.

8. A method for manufacturing an organic EL panel comprising a step of:
   transferring a heat-curable sheet-like adhesive onto either a substrate formed with an organic EL layer or a protecting substrate,
   wherein the heat-curable sheet-like adhesive comprises components (A) to (C), which has tack in a surface of a composition comprising the components (A) to (C) at 25° C.:
   the component (A): a film forming component having an epoxy equivalent of 7000 to 20000 g/eq and having compatibility with the component (B);
   the component (B): an epoxy resin having an epoxy equivalent of 150 to 5000 g/eq and comprising 0 to 20% by weight of a solid epoxy resin at 25° C. with respect to a whole of the component (B); and
   the component (C): an encapsulated epoxy adduct-type latent curing agent.

9. The method for manufacturing the organic EL panel according to claim 8, wherein the heat-curable sheet-like adhesive is heat-cured at 70 to 100° C.

10. The method for manufacturing the organic EL panel according to claim 8, wherein a substrate formed with an organic EL layer and a protecting substrate are bonded to each other over a whole surface with the heat curable sheet-like adhesive.

11. The method for manufacturing the organic EL panel according to claim 8, further comprising a step of heating the heat curable sheet-like adhesive in a state of bonding a substrate formed with an organic EL layer and a protecting substrate to each other over a whole surface after the step of transferring the heat-curable sheet-like adhesive.

* * * * *